United States Patent
Negishi et al.

(10) Patent No.: US 8,513,536 B2
(45) Date of Patent: Aug. 20, 2013

(54) ELECTRONIC CIRCUIT MODULE AND METHOD OF CONNECTING COAXIAL CABLE

(75) Inventors: Nau Negishi, Yokohama (JP); Mikio Nakamura, Tokyo (JP)

(73) Assignee: Olympus Corporation, Tokyo (JP)

( * ) Notice: Subject to any disclaimer, the term of this patent is extended or adjusted under 35 U.S.C. 154(b) by 232 days.

(21) Appl. No.: 12/957,962

(22) Filed: Dec. 1, 2010

(65) Prior Publication Data

US 2011/0127079 A1    Jun. 2, 2011

(30) Foreign Application Priority Data

Dec. 2, 2009    (JP) .................................. 2009-274863

(51) Int. Cl.
  *H05K 1/16*    (2006.01)
(52) U.S. Cl.
  USPC .......................................... 174/260; 174/261
(58) Field of Classification Search
  None
  See application file for complete search history.

(56) References Cited

U.S. PATENT DOCUMENTS

| | | | |
|---|---|---|---|
| 5,517,747 A * | 5/1996 | Pierro et al. | 29/600 |
| 6,911,733 B2 * | 6/2005 | Kikuchi et al. | 257/728 |
| 7,405,582 B2 * | 7/2008 | Mineo et al. | 324/754.08 |
| 7,468,560 B2 * | 12/2008 | Guengerich et al. | 257/784 |
| 2008/0067637 A1 * | 3/2008 | Voutilainen | 257/664 |

FOREIGN PATENT DOCUMENTS

JP    2000-051150    2/2000

* cited by examiner

*Primary Examiner* — Ishwarbhai Patel
(74) *Attorney, Agent, or Firm* — Scully, Scott, Murphy & Presser, P.C.

(57) ABSTRACT

An electronic circuit module is mounted on an electronic circuit board. The electronic circuit module includes an electronic component that has a first electrode and a second electrode that form a facing surface. The electronic circuit module also includes a coaxial cable with a core wire and a shielded wire being exposed in stages. The core wire and the shielded wire of the coaxial cable are directly connected to the first electrode and the second electrode that are exposed at a predetermined cable connecting surface of the electronic component.

3 Claims, 5 Drawing Sheets

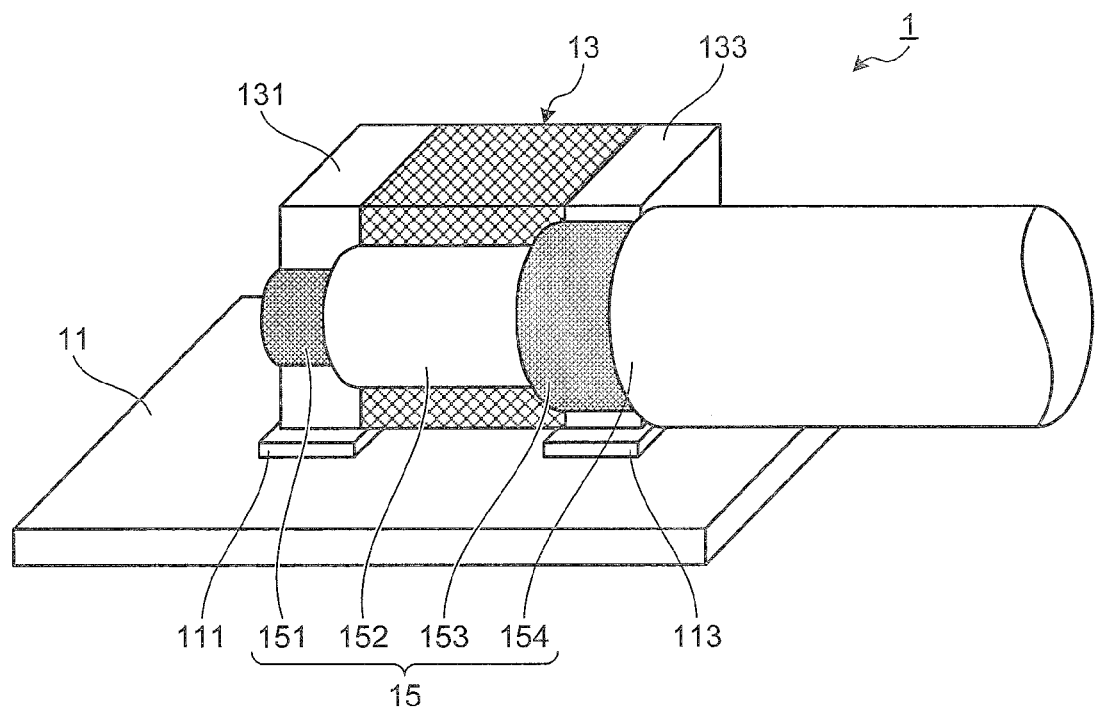
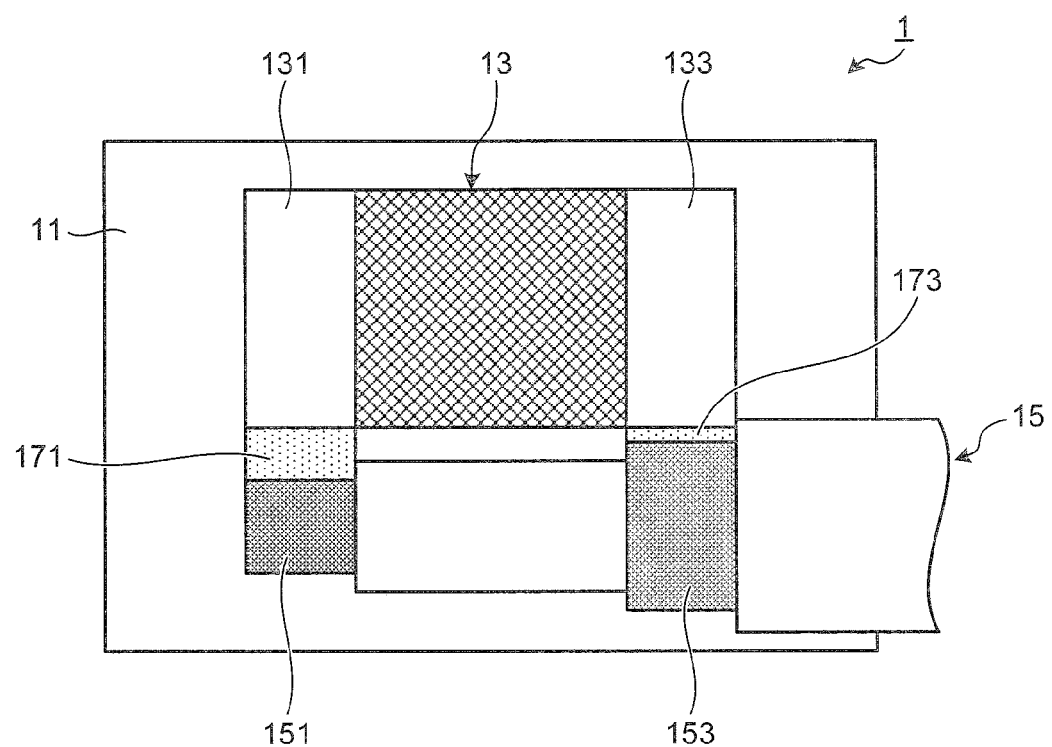

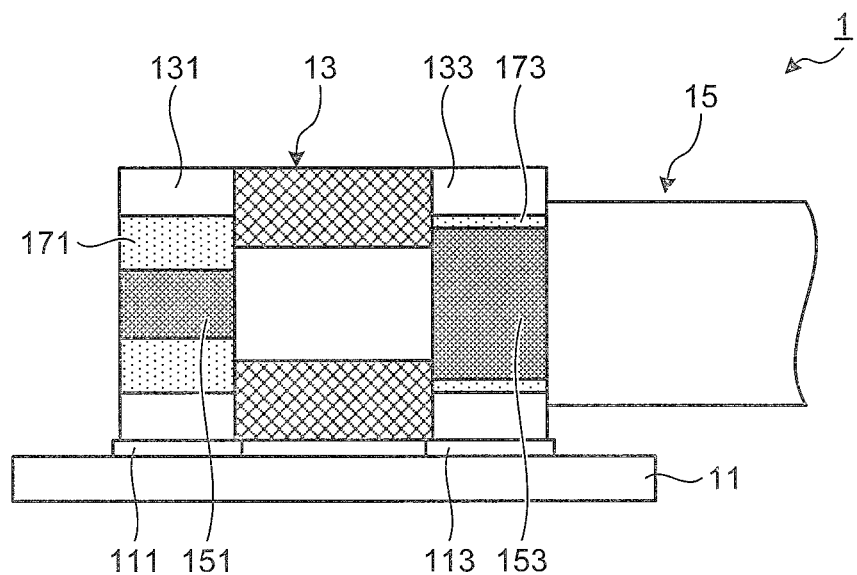
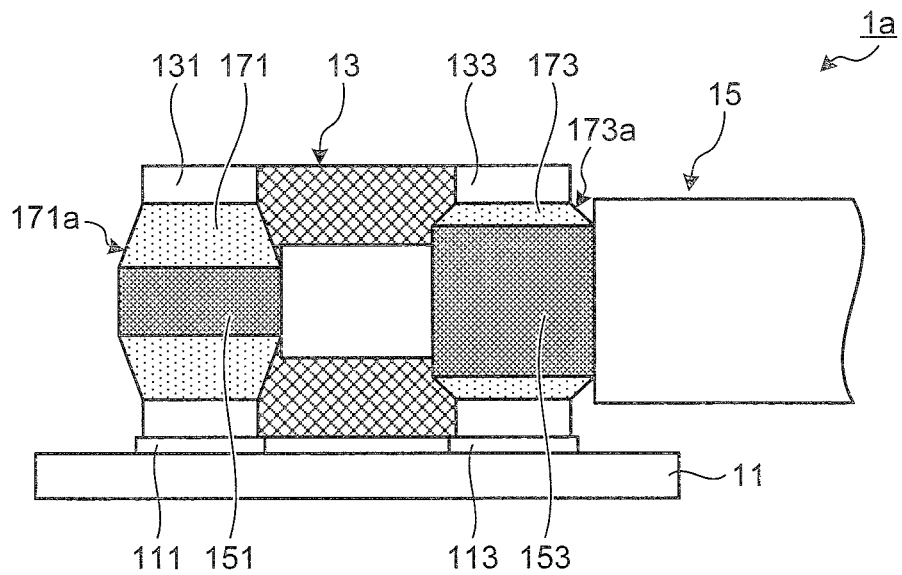

ELECTRONIC CIRCUIT MODULE AND METHOD OF CONNECTING COAXIAL CABLE

CROSS-REFERENCE TO RELATED APPLICATIONS

This application is based upon and claims the benefit of priority from Japanese Patent Application No. 2009-274863, filed on Dec. 2, 2009, the entire contents of which are incorporated herein by reference.

BACKGROUND OF THE INVENTION

1. Field of the Invention

The present invention relates to an electronic circuit module and a method of connecting a coaxial cable.

2. Description of the Related Art

In recent years, various types of electronic equipment become smaller in size. For example, for digital cameras or mobile phones, in order to improve their portability or a cooling effect on heat, the size of casings thereof is reduced and therefore the size of electronic circuit modules themselves is also reduced due to downsizing of an internal space therefor. Endoscopes that are inserted into the body of a subject to observe regions to be observed are designed to accommodate, at a distal end portion of a long thin flexible insertion tool, an electronic circuit module on which an image-capturing device is mounted. With such endoscopes, the insertion tool is inserted into a body cavity to observe regions to be observed. To alleviate patient's pain, there is requirement to make the distal end portion of the insertion tool as short as possible and with a minimum diameter.

In order to meet the requirement, there is a technology for reducing the size of imaging devices by reducing the number of electrodes required for a substrate (see Japanese Laid-open Patent Publication No. 2000-51150). In Japanese Laid-open Patent Publication No. 2000-51150, an external lead terminal of a solid-state imaging device and a coaxial cable are electrically connected, via an electronic component, on the same portion of the substrate.

However, with the technology disclosed in Japanese Laid-open Patent Publication No. 2000-51150, a core wire and a shielded wire of the coaxial cable are separately wired, and these wired core wire and shielded wire are connected to the electronic component arranged on the substrate. Accordingly, a space for wiring the core wire and the shielded wire is required in the electronic circuit module, which causes a problem in that the size of the device cannot be sufficiently reduced.

SUMMARY OF THE INVENTION

An electronic circuit module according to an aspect of the present invention includes an electronic component that is mounted on an electronic circuit board and that has a first electrode and a second electrode that form a facing surface; and a coaxial cable with a core wire and a shielded wire being exposed in stages. The core wire and the shielded wire are directly connected to the first electrode and the second electrode, respectively, the first electrode and the second electrode being exposed at a predetermined cable connecting surface of the electronic component.

A method according to another aspect of the present invention is of connecting a coaxial cable to an electronic component that includes a first electrode and a second electrode that constitute a facing surface. The method includes exposing a shielded wire of the coaxial cable so as to conform to a width of a predetermined cable connecting surface of the electronic component; exposing an internal insulator of the coaxial cable by leaving the exposed shielded wire so as to conform to a width of the second electrode that is exposed at the cable connecting surface; exposing a core wire of the coaxial cable by conforming to a width of the first electrode that is exposed at the cable connecting surface; and connecting the exposed core wire and the exposed shielded wire to the first electrode and the second electrode, respectively, the first electrode and the second electrode being exposed at the cable connecting surface.

The above and other features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a schematic perspective view of an example configuration of an electronic circuit module according to an embodiment;

FIG. 2 is a plan view of the electronic circuit module according to the embodiment;

FIG. 4 is another schematic diagram illustrating a method of connecting the coaxial cable;

FIG. 5 is a side view illustrating a cable connecting surface side of an electronic circuit module according to a modification;

DETAILED DESCRIPTION OF THE PREFERRED EMBODIMENTS

Figure 3A:
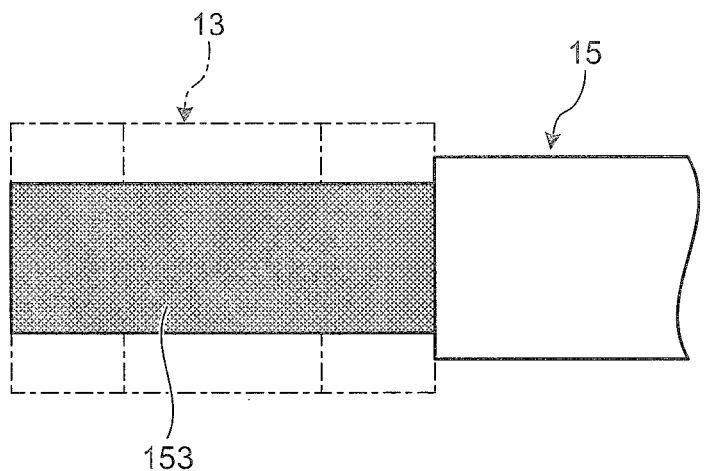
FIGS. 3A to 3C are schematic diagrams illustrating a method of connecting a coaxial cable.

In the following, a preferred embodiment of an electronic circuit module according to the present invention will be described in detail with reference to the accompanying drawings. However, the present invention is not limited to the embodiment. In the drawings, elements that are identical to those in embodiments are assigned the same reference numerals.

FIG. 1 is a schematic perspective view of an example configuration of an electronic circuit module 1 according to an embodiment of the present invention. FIG. 2 is a plan view of the electronic circuit module 1. As illustrated in FIG. 1, the electronic circuit module 1 according to the embodiment of the present invention includes an electronic circuit board 11, an electronic component 13, and a coaxial cable 15.

The electronic circuit board 11 includes electronic component electrodes 111 and 113 arranged on the main surface (upper surface) of the electronic circuit board 11. The electronic component electrodes 111 and 113 are used to mount the electronic component 13. The electronic component 13 is mounted on the upper surface of the electronic circuit board 11 via these electronic component electrodes 111 and 113.

The electronic component 13 includes a positive electrode 131 and a negative electrode 133 that constitute a facing surface (side surface). On each of the surfaces excluding that side surface constituted by the positive electrode 131 and the negative electrode 133, end surfaces of the positive electrode 131 and the negative electrode 133 are exposed. The end surfaces of the exposed positive electrode 131 and the exposed negative electrode 133 form, on each of the surfaces, edge portions having a predetermined width. End surfaces of the positive electrode 131 and the negative electrode 133 that are exposed at a lower surface of the electronic component 13 and that constitute an edge portion are connected to the electronic component electrodes 111 and 113 using a conductive material by soldering or the like. The electronic component 13 having such a configuration is mounted on the electronic circuit board 11. Examples of the electronic component 13 include an IC or a chip capacitor.

The coaxial cable 15 is configured such that a shielded wire 153 is arranged, via an internal insulator 152, on an outer circumference of a core wire 151, and an external insulator 154 is arranged on an outer circumference of the shielded wire 153. The coaxial cable 15 is prepared in such a manner that the side surface of the core wire 151 and the side surface of the shielded wire 153 are exposed in stages at the distal end portion of the coaxial cable 15 and are directly connected to, for example, the positive electrode 131 and the negative electrode 133 that constitute the edge portion and that are exposed at the side surface of the electronic component 13 on the proximal side in FIG. 1 (hereinafter, referred to as a "cable connecting surface"). Specifically, as illustrated in FIG. 2, at the distal end portion of the coaxial cable 15, the side surface of the exposed core wire 151 is disposed facing the end surface of the positive electrode 131 that is exposed at the cable connecting surface. The core wire 151 is directly connected to the positive electrode 131 via a conductive material 171 such as conductive resin (e.g., a conductive film, a conductive paste) or solder. Furthermore, the side surface of the exposed shielded wire 153 is disposed facing the end surface of the negative electrode 133 that is exposed at the cable connecting surface. The shielded wire 153 is directly connected to the negative electrode 133 via a conductive material 173 such as conductive resin or solder. With this configuration, the core wire 151 and the shielded wire 153 of the coaxial cable 15 are electrically connected to the electronic circuit board 11 via the positive electrode 131 and the negative electrode 133 that function as the electronic component.

In the following, a method of manufacturing the electronic circuit module 1 will be described. In the manufacturing method, first, the electronic component 13 is mounted on the electronic circuit board 11, and then the coaxial cable 15 is connected, so that the electronic circuit module 1 is formed. Specifically, first, the electronic component 13 is disposed on the upper surface of the electronic circuit board 11. Then, the end surfaces of the positive electrode 131 and the negative electrode 133 that are exposed at the lower surface of the electronic component 13 and that constitute the edge portion are brought into contact with the electronic component electrodes 111 and 113 and they are connected to each other by, for example, soldering (a component mounting process).

Figure 3B:
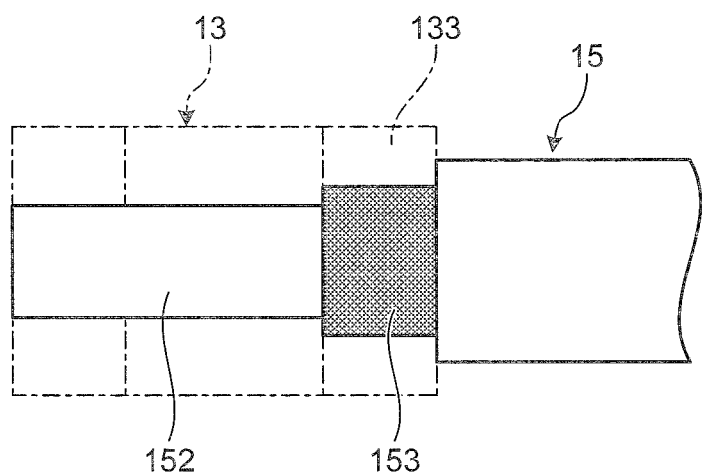
Figure 3C:
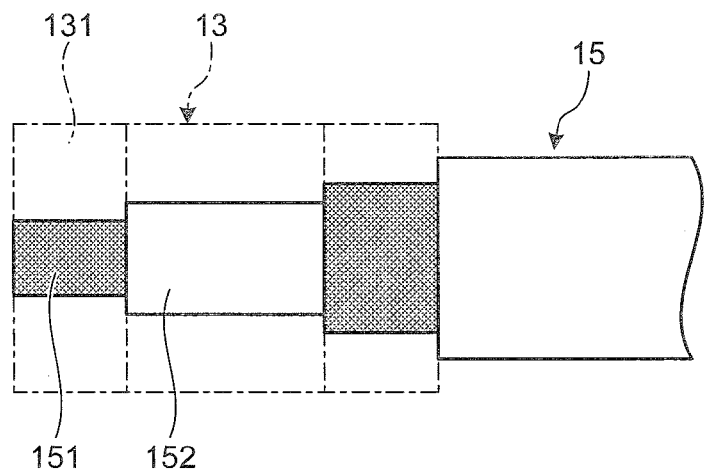

Subsequently, the coaxial cable 15 is connected (cable connecting process). In the cable connecting process, first, at the distal end portion of the coaxial cable 15, the side surface of the core wire 151 and the side surface of the shielded wire 153 are exposed in stages. FIGS. 3A to 3C and 4 are schematic diagrams illustrating a method of connecting the coaxial cable 15 in the cable connecting process. In FIGS. 3A to 3C, the cable connecting surface of the electronic component 13 to which the coaxial cable 15 is connected is illustrated by the dashed line.

First, as illustrated in FIG. 3A, at the distal end portion of the coaxial cable 15, the shielded wire 153 is exposed by a length equal to the widths of the positive electrode 131 and the negative electrode 133 on the cable connecting surface of the electronic component 13 in a direction in which the positive electrode 131 and the negative electrode 133 opposes the distal end portion of the coaxial cable 15 (in the longitudinal direction of the cable connecting surface; hereinafter, simply referred to as the "facing direction") (shielded wire exposing process). For example, by stripping the distal end portion of the external insulator 154 using a laser stripper, the shielded wire 153 is exposed by a length equal to the width of the cable connecting surface in the facing direction.

Subsequently, as illustrated in FIG. 3B, by leaving the shielded wire 153 by a length equal to the width, in the facing direction, of the negative electrode 133 exposed at the cable connecting surface of the electronic component 13, the internal insulator 152 is exposed on the distal end side (internal insulator exposing process). Specifically, by leaving the shielded wire 153 by a length equal to the width of the negative electrode 133 in the facing direction, the distal end of the shielded wire 153 is stripped using the laser stripper to expose the internal insulator 152.

Then, as illustrated in FIG. 3C, on the distal end side of the exposed internal insulator 152, the core wire 151 is exposed by a length equal to the width, in the facing direction, of the positive electrode 131 that is exposed at the cable connecting surface of the electronic component 13 (core wire exposing process). Specifically, the distal end of the internal insulator 152 is stripped using the laser stripper to expose the core wire 151 by a length equal to the width of the positive electrode 131 in the facing direction.

Thereafter, the coaxial cable 15 is arranged in such a manner that the axial direction thereof is along the upper surface of the electronic circuit board 11 and the distal end portion is made to oppose the cable connecting surface of the electronic component 13. Then, as illustrated in FIG. 4, the side surface of the core wire 151 that is exposed the width of the positive electrode 131 in the facing direction is arranged so as to oppose the end surface of the of the positive electrode 131 that is exposed at the cable connecting surface. By arranging the conductive material 171 between the core wire 151 and the positive electrode 131, the core wire 151 and the positive electrode 131 are directly connected. Similarly, the side surface of the shielded wire 153 that is exposed by conforming to with the width of the negative electrode 133 in the facing direction is arranged so as to oppose the end surface of the negative electrode 133 that is exposed at the cable connecting surface. By arranging the conductive material 173 between the shielded wire 153 and the negative electrode 133, the shielded wire 153 and the negative electrode 133 are directly connected (connecting process). In this way, the electronic circuit module 1 is obtained.

As described above, according to the embodiment of the present invention, the side surface of the core wire 151 that is exposed at the distal end portion of the coaxial cable 15 is connected to the end surface of the positive electrode 131 that is exposed at the cable connecting surface. Similarly the side surface of the shielded wire 153 that is exposed at the distal end portion of the coaxial cable 15 is connected to the side surface of the negative electrode 133 that is exposed at the cable connecting surface. Accordingly, it is possible to directly connect the core wire 151 and the shielded wire 153 of the coaxial cable 15 to the positive electrode 131 and the negative electrode 133 of the electronic component 13, respectively. Therefore, it is possible to electrically connect the core wire 151 and the shielded wire 153 of the coaxial cable 15 to the electronic circuit board 11 via the positive electrode 131 and the negative electrode 133 of the electronic component without wiring the core wire and the shielded wire of the coaxial cable like the technology disclosed in Japanese Laid-open Patent Publication No. 2000-51150 described above. According to the embodiment of the present invention, because no space is needed for wiring the core wire and the shielded wire in the electronic circuit module, the size of the electronic circuit module 1 can be further reduced. Furthermore, the connecting operation between the electronic component 13 and the coaxial cable 15 is easy, thus increasing the efficiency of the manufacturing process of the electronic circuit module 1. The electronic circuit module 1 can be used for an imaging device that is installed in, for example, the distal end portion of an endoscope.

In the embodiment described above, the core wire 151 and the shielded wire 153 are exposed at the distal end portion of the coaxial cable 15 by a length corresponding to the width in the facing direction of the positive electrode 131 and the negative electrode 133 that are exposed at the cable connecting surface of the electronic component 13. Alternatively, the length of the core wire 151 and the shielded wire 153 that are exposed at the distal end portion of the coaxial cable 15 can be longer than the widths in the facing direction of the positive electrode 131 and the negative electrode 133 that are exposed at the cable connecting surface.

FIG. 5 is a side view illustrating a cable connecting surface side of an electronic circuit module 1a according to a modification of the present invention. As illustrated in FIG. 5, in the electronic circuit module 1a, the length of the core wire 151 that is exposed at the distal end portion of the coaxial cable 15 is longer than the width in the facing direction of the positive electrode 131 that is exposed at the cable connecting surface of the electronic component 13. Furthermore, the length of the shielded wire 153 that is exposed at the distal end portion is longer than the width in the facing direction of the negative electrode 133 that is exposed at the cable connecting surface of the electronic component 13. In this way, by making the lengths of the core wire 151 and the shielded wire 153 that are exposed at the distal end portion longer than the widths in the facing direction of the positive electrode 131 and the negative electrode 133 that are exposed at the cable connecting surface, fillets 171a and 173a are formed when the side surface of the core wire 151 is connected to the end surface of the positive electrode 131 and when the side surface of the shielded wire 153 is connected to the side surface of the negative electrode 133 using the conductive materials 171 and 173, respectively. Accordingly, it is possible to connect them strongly.

Furthermore, in the embodiment described above, a case is described as an example in which the side surface of the electronic component 13 is used as the cable connecting surface; however, it is not limited thereto. Any of the surfaces of the electronic component 13 constituting the edge portion in which the end surface of the positive electrode 131 and the negative electrode 133 are exposed can be used as the cable connecting surface. However, because the end surfaces of the positive electrode 131 and the negative electrode 133 that are exposed at the lower surface of the electronic component 13 are connected to the electronic component electrodes 111 and 113 of the electronic circuit board 11, surfaces except for the lower surface can be used as the cable connecting surface. Specifically, instead of the side surface of the proximal side of the electronic component 13 illustrated in FIG. 1 in the above-described embodiment, a side surface opposite side from that side surface or an upper surface can also be used as the cable connecting surface.

Figure 6:
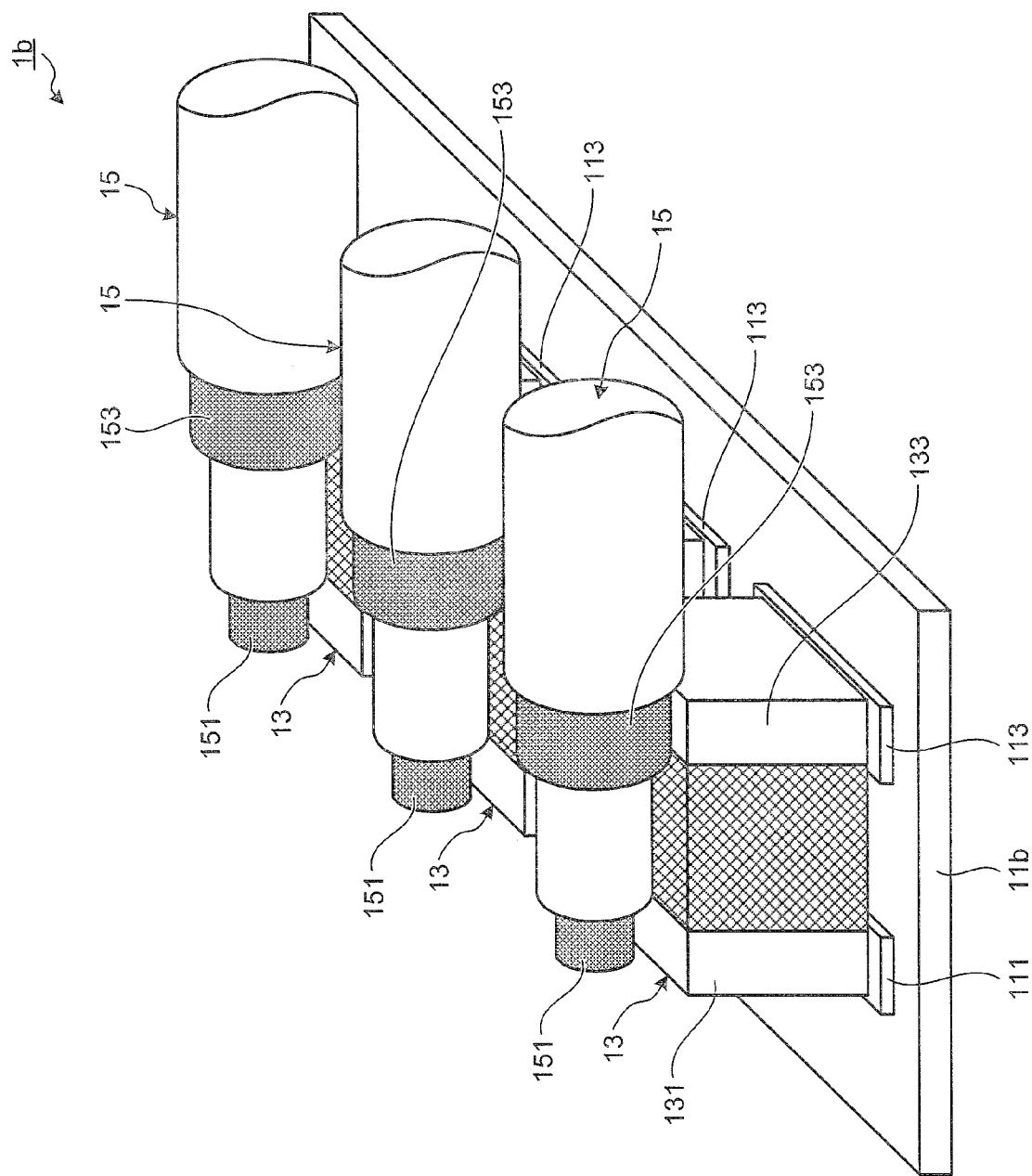
FIG. 6 is a schematic perspective view of an example configuration of an electronic circuit module according to a modification.

FIG. 6 is a schematic perspective view of an example configuration of an electronic circuit module 1b according to a modification of the present invention. FIG. 6 illustrates an example of connecting the coaxial cable 15 when the upper surface is used as the cable connecting surface. In FIG. 6, elements that are identical to those of the embodiment described above are assigned the same reference numerals.

With the electronic circuit module 1b according to the modification of the present invention, a plurality of pairs of the electronic component electrodes 111 and 113 (three pairs in the example illustrated in FIG. 6) is arranged on the upper surface of an electronic circuit board 11b. A plurality of electronic components 13 (for example, three) is mounted on the upper surface of the electronic circuit board 11b via the plurality of pairs of the electronic component electrodes 111 and 113. In this case, in a similar process as in the embodiment described above, a plurality of coaxial cables 15 (for example, three) are prepared, in which the side surfaces of the core wires 151 and the shielded wires 153 are exposed, in stages at the distal end portion, by conforming to the width in the direction of the upper surface, which is the cable connecting surface, of the electronic components 13. Then, each of the exposed core wires 151 and the exposed shielded wires 153 of each coaxial cable 15 is connected to the end surface of the positive electrode 131 and the negative electrode 133 that are exposed at the upper surface of the electronic component 13. Although not illustrated in FIG. 6, the side surface of the core wire 151 is connected to the end surface of the positive electrode 131 using a conductive material. Similarly, the side surface of the shielded wire 153 is connected to the end surface of the negative electrode 133 using the conductive material.

As described above, the same advantage as that described in the above-described embodiment can be provided even when the upper surface is used as the cable connecting surface. Furthermore, as illustrated in FIG. 6, if a plurality of electronic components 13 are mounted on the electronic circuit board 11b, the gap between the electronic components 13 for the arrangement can be equal to or less than the diameter of the coaxial cable 15. Accordingly, the gap between the electronic components 13 for the arrangement can be narrowed down to a distance equal to or less than the diameter of the coaxial cable 15, thus reducing the size of the electronic circuit module 1b by suppressing an increase in a width of the electronic circuit module 1b in the distal direction relative to the plane of FIG. 6. Specifically, if the diameter of the coaxial cable 15 is greater than the width of the electronic component 13 in the direction in which the electronic components 13 are arranged (the width in the distal direction relative to the plane of FIG. 6), the gap between the electronic components 13 for the arrangement can be a length equal to the diameter of the coaxial cable 15. In contrast, if the width of the electronic component 13 in the direction in which the electronic components 13 are arranged is greater than the diameter of the coaxial cable 15, the gap between the electronic components 13 for the arrangement can be a length equal to the width of the electronic component 13 in the direction in which the electronic components 13 are arranged.

In the embodiment described above, the electronic circuit module 1 is formed by performing, first, the component mounting process and then performing the cable connecting process. Alternatively, the cable connecting process can be performed first to connect the electronic component 13 to the coaxial cable 15, and then the component mounting process can be performed to mount the electronic component 13 on the electronic circuit board 11.

Figure 7:
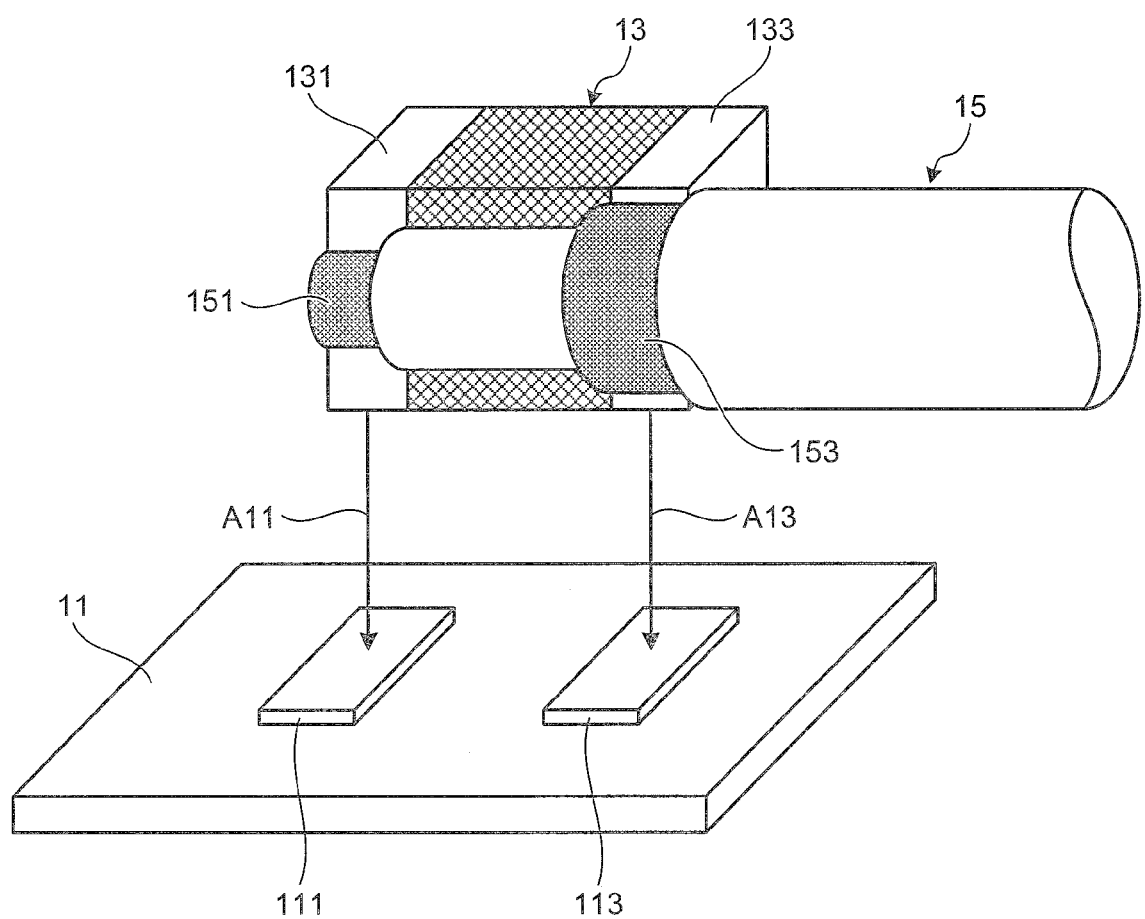
FIG. 7 is a schematic diagram illustrating a method of manufacturing the electronic circuit module according to the modification.

FIG. 7 is a schematic diagram illustrating a method of manufacturing the electronic circuit module 1 according to the modification of the present invention. In the manufacturing process, as illustrated in FIG. 7, in a similar manner as in the embodiment described above, the lower surface of the electronic component 13, in which the core wire 151 and the shielded wire 153 of the coaxial cable 15 are directly connected to the positive electrode 131 and the negative electrode 133 of the electronic component 13, is disposed opposite the upper surface of the electronic circuit board 11. Then, as indicated by the arrows A11 and A13 in FIG. 7, the positive electrode 131 that is exposed at the lower surface of the electronic component 13 is brought into contact with the electronic component electrode 111 and they are connected each other by, for example soldering. Similarly, the negative electrode 133 that is exposed at the lower surface of the electronic component 13 is brought into contact with the electronic component electrode 113 and they are connected each other by, for example soldering. Then, the electronic component 13 is mounted on the upper surface of the electronic circuit board 11.

In the embodiment described above, to simplify the description, a case is described in which the core wire and the shielded wire are exposed at the distal end portion of the coaxial cable, and the distal end portion of the coaxial cable with the core wire and the shielded wire being exposed are connected to the electronic component; however the present invention is not limited thereto. In other words, in the coaxial cable, a portion in which the core wire and the shielded wire are exposed is not limited the distal end portion. For example, any portion, such as the midpoint of the coaxial cable can also be exposed. The core wire and the shielded wire that are exposed at a given portion of the coaxial cable can be directly connected to the positive electrode and the negative electrode of the electronic component. The coaxial cable can be connected to the electronic component at a position where the core wire and the shielded wire are exposed.

According to an aspect of the present invention, it is possible to directly connect a core wire and a shielded wire of a coaxial cable to a positive electrode and a negative electrode of an electronic component, respectively. Accordingly, there is no need to wire the core wire and the shielded wire of the coaxial cable. Therefore, because no space is needed for wiring the core wire and the shielded wire in an electronic circuit module, the size of the electronic circuit module can be further reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic circuit module comprising:
   an electronic component that is mounted on an electronic circuit board and that has a first electrode and a second electrode that form a facing surface; and
   a coaxial cable with a core wire and a shielding wire being exposed in stages,
   wherein a side surface of the exposed core wire and a side surface of the exposed shielding wire are directly connected to the first electrode and the second electrode, respectively, the first electrode and the second electrode being exposed at a predetermined cable connecting surface of the electronic component, and
   the exposed core wire has a length substantially equal to a width of the first electrode exposed at the cable connecting surface, and the exposed shielding wire has a length substantially equal to a width of the second electrode exposed at the cable connecting surface.

2. The electronic circuit module according to claim 1, wherein
   the exposed core wire has a length equal to or greater than a width of the first electrode exposed at the cable connecting surface, and
   the exposed shielded wire has a length equal to or greater than a width of the second electrode exposed at the cable connecting surface.

3. The electronic circuit module according to claim 1, wherein the first electrode is connected to a first electronic component electrode arranged on an upper surface of the electronic circuit board at a surface other than the cable connecting surface, and the second electrode is connected to a second electronic component electrode arranged on the upper surface of the electronic circuit board at a surface other than the cable connecting surface.

* * * * *